US009128709B2

(12) United States Patent
Liu et al.

(10) Patent No.: US 9,128,709 B2
(45) Date of Patent: Sep. 8, 2015

(54) DIVIDING A POWER INPUT AND DIRECTLY PROVIDING DIVIDED POWER TO AN OUTPUT TERMINAL IN A POWER CONTROL CIRCUIT

(75) Inventors: Hsing-Chang Liu, Taipei (TW); Ming-Hsien Tsai, Pingtung County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 199 days.

(21) Appl. No.: 13/468,008

(22) Filed: May 9, 2012

(65) Prior Publication Data

US 2013/0238910 A1 Sep. 12, 2013

(30) Foreign Application Priority Data

Mar. 9, 2012 (TW) .............................. 101108152 A

(51) Int. Cl.
*G06F 1/32* (2006.01)
*G11C 16/12* (2006.01)
*H03K 17/693* (2006.01)
*G06K 19/07* (2006.01)
*G06K 19/077* (2006.01)

(52) U.S. Cl.
CPC .......... *G06F 1/3203* (2013.01); *G06K 19/0727* (2013.01); *G06K 19/07769* (2013.01); *G11C 16/12* (2013.01); *H03K 17/693* (2013.01)

(58) Field of Classification Search
CPC .................................. G06F 1/3203; G06F 1/26
USPC ........................................................ 713/300
See application file for complete search history.

(56) References Cited

U.S. PATENT DOCUMENTS

| 3,719,830 | A | * | 3/1973 | Ananiades | .................... | 326/124 |
| 5,490,117 | A | | 2/1996 | Oda et al. | | |
| 5,517,153 | A | * | 5/1996 | Yin et al. | ....................... | 327/546 |
| 5,570,258 | A | * | 10/1996 | Manning | ......................... | 361/85 |
| 5,739,597 | A | * | 4/1998 | Bailey et al. | ..................... | 307/85 |
| 5,969,565 | A | * | 10/1999 | Naganawa | .................... | 327/536 |
| 6,242,971 | B1 | * | 6/2001 | Manstretta et al. | .......... | 327/537 |
| 6,600,352 | B2 | | 7/2003 | Miyamoto | | |

(Continued)

FOREIGN PATENT DOCUMENTS

CN 1790392 6/2006
JP 2000124780 * 4/2000

OTHER PUBLICATIONS

"Office Action of Chinese Counterpart Application", issued on Feb. 10, 2015, p. 1-p. 15.

*Primary Examiner* — Thomas Lee
*Assistant Examiner* — Santosh R Poudel
(74) *Attorney, Agent, or Firm* — Jianq Chyun IP Office

(57) ABSTRACT

A memory card with a smart card function including a flash memory unit, a data processing control unit, and a power control unit is provided. The data processing control unit is coupled to the flash memory unit. The data processing control unit controls the flash memory unit and encrypts, decrypts and stores smart card security data. The power control unit receives at least one of a first power input and a second power input. The power control unit selects the first power input or the second power input and provides the selected one to the data processing control unit according to at least one control signal. An output terminal of the power control unit is coupled to the first power input. Furthermore, a power control method and a power control circuit of the forgoing memory card are also provided.

21 Claims, 5 Drawing Sheets

(56) References Cited

U.S. PATENT DOCUMENTS

| | | | |
|---|---|---|---|
| 7,572,152 B2* | 8/2009 | Mosek et al. | 439/631 |
| 7,781,920 B2* | 8/2010 | Malašek | 307/141.4 |
| 7,841,534 B2* | 11/2010 | Bacastow | 235/472.02 |
| 8,451,049 B2* | 5/2013 | Miyanoiri | 327/530 |
| 2004/0141520 A1* | 7/2004 | Holub-Gorny et al. | 370/463 |
| 2004/0232248 A1* | 11/2004 | Cho | 235/492 |
| 2006/0186211 A1* | 8/2006 | Kim et al. | 235/492 |
| 2008/0048500 A1* | 2/2008 | Kihara et al. | 307/80 |
| 2008/0189550 A1* | 8/2008 | Roundtree | 713/176 |
| 2008/0246702 A1* | 10/2008 | Lee et al. | 345/77 |
| 2009/0302902 A1* | 12/2009 | Do | 327/143 |
| 2010/0029202 A1* | 2/2010 | Jolivet et al. | 455/41.1 |
| 2010/0181377 A1* | 7/2010 | Chen et al. | 235/440 |
| 2010/0202609 A1* | 8/2010 | Sandhu et al. | 380/44 |
| 2012/0001608 A1* | 1/2012 | Sato et al. | 323/282 |

* cited by examiner

DIVIDING A POWER INPUT AND DIRECTLY PROVIDING DIVIDED POWER TO AN OUTPUT TERMINAL IN A POWER CONTROL CIRCUIT

CROSS-REFERENCE TO RELATED APPLICATION

This application claims the priority benefit of Taiwan application serial no. 101108152, filed on Mar. 9, 2012. The entirety of the above-mentioned patent application is hereby incorporated by reference herein and made a part of this specification.

BACKGROUND OF THE DISCLOSURE

1. Technology Field

The disclosure generally relates to a power control method and a power control circuit, and more particularly, to a power control method and a power control circuit for a memory card with a smart card function.

2. Description of Related Art

Smart cards have been broadly used along with the widespread use of e-wallet and prepayment applications. A smart card is an integrated circuit (IC) card embedded with such components as a microprocessor, a card operating system, a security module, and a memory and which allows a card holder to perform various predetermined operations. Besides the function of data storage, a smart card also offers calculation, encryption, bidirectional communication, and security functions such that data stored in the smart card can be protected. A subscriber identification module (SIM) card used in a GSM (Global System for Mobile Communications) cellular phone is one of the many applications of smart cards. Generally speaking, a smart card has very limited storage capacity due to the specification of the IC therein.

Generally speaking, a user can access data in a memory card through a card reader. Thus, in an application wherein a smart card is integrated with a memory card, data stored in the memory card and the smart card can only be read through a card reader in a contact manner. However, along with the development of near field communication (NFC), many contactless sensing techniques have been broadly applied in our daily life, such as transit fare cards and access cards, etc.

Accordingly, a memory card combined with a smart card and a contactless access function such as a Micro Secure Digital (micro SD) memory card is developed. This kind of memory card receives different power inputs when being read by a reading apparatus within a host system under different conditions. Hence, if the smart card circuit inside the memory card can not work normally when any one of different power inputs is supplied, then the application range thereof will be significantly limited.

Nothing herein should be construed as an admission of knowledge in the prior art of any portion of the disclosure. Furthermore, citation or identification of any document in this application is not an admission that such document is available as prior art to the disclosure, or that any reference forms a part of the common general knowledge in the art.

SUMMARY OF THE DISCLOSURE

Accordingly, the disclosure is directed to a memory card with a smart card function. When any one of different power inputs is selected to supply the power, a smart card circuit in the memory card can work normally.

The disclosure is directed to a power control method of a memory card, by which one of two power inputs for the memory card with a smart card function can be selected to supply the power. In the meantime, the smart card circuit in the memory card can work normally.

The disclosure is directed to a power control circuit adapted for applying to an electronic circuit. When one of different power inputs is selected to input to the electronic circuit, the electronic circuit can work normally.

The disclosure is directed to a memory card with a smart card function, which includes a flash memory unit, a data processing control unit and a power control unit. The data processing control unit is coupled to the flash memory unit. The data processing control unit controls the flash memory unit, and encrypts, decrypts and stores a smart card security data. The power control unit is coupled to the data processing control unit and the flash memory unit. The power control unit receives at least one of a first power input and a second power input. The power control unit selects the first power input or the second power input and provides the selected one to the data processing control unit according to at least one control. An output terminal of the power control unit is coupled to the first power input.

The disclosure is directed to power control method of a memory card. The memory card includes a power control unit and a data processing control unit. The power control method includes the following steps. At least one of a first power input and a second power input is received. The first power input or the second power input is selected, and the selected one is provided to a smart card circuit in the data processing control unit according to at least one control signal. An output terminal of the power control unit is coupled to the first power input.

The disclosure is directed to a power control circuit, which includes a first power supply channel, a second power supply channel, and a voltage limiting unit. The first power supply channel is configured to receive the first power input and determine whether to provide the first power input to the data processing control unit according to a first control signal. The second power supply channel is configured to receive the second power input and determine whether to provide the second power input to the data processing control unit according to a second control signal. The voltage limiting unit is coupled between the first power supply channel and the second power supply channel for limiting a reverse voltage fed back to the second power supply channel from the first power supply channel to smaller than a specific value or limiting the reverse voltage fed back to the first power supply channel from the second power supply channel to smaller than the specific value.

In view of the foregoing, the memory card with the smart card function according to the disclosure can conduct a near field communication (NFC). Meanwhile, with the power control method according to the disclosure, when one of two power inputs for the memory card is selected to supply the power, the smart card circuit in the memory can work normally.

These and other exemplary embodiments, features, aspects, and advantages of the invention will be described and become more apparent from the detailed description of exemplary embodiments when read in conjunction with accompanying drawings.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
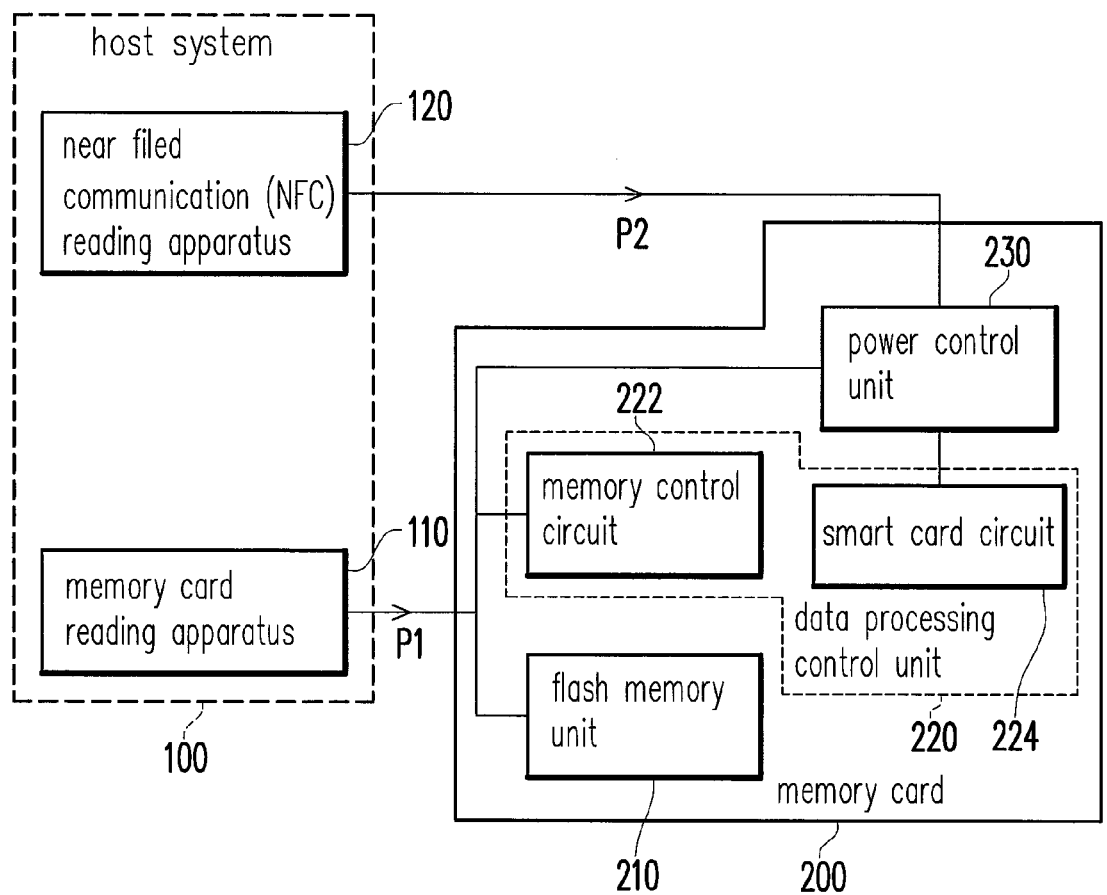
FIG. 1 is a schematic block diagram illustrating a memory card and a host system thereof according to an exemplary embodiment of the disclosure.

Embodiments of the disclosure may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

FIG. 1 is a schematic block diagram illustrating a memory card and a host system thereof according to an exemplary embodiment of the disclosure. Referring to FIG. 1, a host system 100 of the present exemplary embodiment includes a memory card reading apparatus 110 and a near field communication (NFC) reading apparatus 120. Here, the host system 100 is, for example, a portable electronic communication apparatus (e.g. a mobile phone, or a table computer), but the disclosure is not limited thereto. According to the present exemplary embodiment, a memory card 200 includes a flash memory unit 210, a data processing control unit 220 and a power control unit 230. The data processing control unit 220 includes a memory control circuit 222 and a smart card circuit 224. The memory control circuit 222 is coupled to the flash memory unit 210. The smart card circuit 224 is coupled to the memory control circuit 222. The memory card 200 is, for example, a micro security digital (micro SD) memory card, combined with a smart card and a contactless access function. Therefore, the memory card reading apparatus 110 of the present exemplary embodiment is, for example, a micro SD memory card reading apparatus. Furthermore, in the present exemplary embodiment, the flash memory unit 210, the data processing control unit 220 and the power control unit 230 may be respectively implemented by separate chips or by integrating all functions thereof in a single chip.

The memory card reading apparatus 110 is used for identifying a data format in compliance with the security digital (SD) standard and transforming the data format to the format identifiable to the host system 100. Specifically, the memory card reading apparatus 110 of the exemplary embodiment is used for connecting with the memory card 200. The memory card 200 is inserted into the memory card reading apparatus 110, for example, in a separable manner, and thus the host system 100 accesses the inserted memory card 200 through the memory card reading apparatus 110. According to the present exemplary embodiment, a user may insert the memory card 200 into the memory card reading apparatus 110 to connect with the host system 100 so as to execute a contact communication in compliance with the ISO 7816-3 standard. For example, the user may insert the memory card 200 having a financial smart card security data into the memory card reading apparatus 110 and proceed with payment for on-line shopping via the host system 100 and the Internet.

The NFC reading apparatus 120 is used for receiving and sending a radio frequency (RF) signal so as to execute data communication with a reading apparatus (e.g. an RF reader, which is not shown). The data communication manner is, for example, in compliance with a near field communication (NFC) standard or other wireless communication standards. That is, according to the present exemplary embodiment, the user may insert the memory card 200 into the memory card reading apparatus 110 and conduct a contactless near field communication in compliance with the ISO 14443 standard with other contactless-type reading apparatus by using the NFC reading apparatus 120. For example, the user may insert a memory card 200 having the smart card security data of transit ticket to the memory card reading apparatus 110. When traveling by the mass rapid transit (MRT) system, the user may pay by communicating with reading apparatuses deployed in the MRT stations in the contactless manner. Otherwise, the user may insert the memory card 200 having the financial smart card security data into the memory card reading apparatus 110 and pay for shopping in relative shops (e.g. gas stations or convenience stores) by communicating with the reading apparatuses deployed in the shops in the contactless manner.

The data processing control unit 220 is used for controlling the operation of the memory card 200. The data processing control unit 220 controls the flash memory unit 210 by using the memory control circuit 222 and encrypts, decrypts and stores a smart card security data by the smart card circuit 224. According to the present exemplary embodiment, the smart card circuit 224 is, for example, a universal Integrated circuit card (UICC) for storing information, such as subscriber information, key passwords and payment modes. The smart card circuit 224 receives the smart card security data from the host system 100 or transmits the processed smart card security data to the host system 100 via the memory control circuit 222 (or via a wireless information transmitting unit). Generally, since the data in the smart card circuit 224 is highly secure, the smart card security data processed by using the smart card circuit 224 can be applied to, for example, identity verification or micro payment. The smart card security data is, for example, MRT transit card data and financial data. In the present exemplary embodiment, an interface of the smart card circuit 224 is compliant with the ISO 7816-3 and the ISO 14443 standards. However, the disclosure is not limited thereto. The smart card circuit 224 may also adopt other data protection mechanisms with a higher security level. It should be noted that the smart card circuit 224 uses encrypting and decrypting methods in compliance with the advanced encryption standard (AES), the data encryption standard (DES), the triple data encryption standard (3DES) and the Rivest-Shamir-Adleman (RSA) algorithm.

The flash memory unit 210 is used for storing the data to be written by the host system 100 according to an instruction from the host system 100 under the control of the memory control circuit 222. Specifically, when the user inserts the memory card 200 into the memory card reading apparatus 110, the host system 100 transmits an instruction (e.g. a write-in instruction or a read-out instruction) to the memory control circuit 222 via the memory card reading apparatus 110. Meanwhile, the memory control circuit 222 controls the flash memory unit 210 according to the received instruction so as to write in the data received from the host system 100 or transmit the data to the host system 100.

For example, in the present exemplary embodiment, the memory control circuit 222 includes a micro processor unit for controlling the overall operation, a buffer memory for temporally storing the data, a flash memory interface module for accessing the flash memory unit 210, a micro SD interface module for communicating with the memory card reading apparatus 110, an interface module for accessing the smart card circuit 224 and an error checking and calibrating module (not shown).

In the present exemplary embodiment, the micro processor unit of the memory control circuit 222 identifies whether the instruction and the data received via the memory card reading apparatus 110 is a general type instruction and data to be directly transmitted to the flash memory unit 210, or otherwise, a smart card instruction or a smart card security data to be processed by the smart card circuit 224. According to the identification result, the micro processor unit of the memory control circuit 222 executes an operation of a data write-in to the flash memory unit 210 or an operation of assigning the instruction or the data to the smart card circuit 224. In addition, as described above, the storage capacity of the smart card circuit 224 is limited due to the specification thereof. According to the present exemplary embodiment, the smart card security data in the smart card chip 224 can be stored into the flash memory unit 210 which has a larger storage capacity than that of the smart card chip 224 under the management of the memory control circuit 222.

The power control unit 230 is coupled to the data processing control unit 220 and the flash memory unit 210. The power control unit 230 receives at least one of a first power input P1 and a second power input P2. The power control unit 230 selects the first power input P1 or the second power input P2 and provides the selected one to the smart card circuit 224 according to at least one control signal (not shown). In the present exemplary embodiment, the first power input P1 is provided by the memory card reading apparatus 110. The second power input P2 is provided by the NFC reading apparatus 120, but the disclosure is not limited thereto. The first power input and the second power input may be various types of power supply apparatuses.

Specifically, if the host system 100 is under a normal operation mode, the first power input P1 is provided to the smart card circuit 224 by the memory card reading apparatus 110. At this time, the first power input P1 is, for example, 3.3V. Accompanying with the circuit design of the power control unit 230 in the present exemplary embodiment, the smart card circuit 224 can work normally. Another operation mode is to read the host system 100 by an NFC reading apparatus 120. Under such an operation mode, the second power input P2 is provided when the host system 100 approaches an NFC transmitting apparatus, and the host system 100 detects a signal of the NFC reading apparatus and decides to receive the second power input P2. At this time, the second power input P2 is, for example, 1.8V. Accompanying with the circuit design of the power control unit 230 in the present exemplary embodiment, the smart card circuit 224 can also work normally. In other words, in the present exemplary embodiment, when one of the memory card reading apparatus 110 or the NFC reading apparatus 120 is powered on, the smart card circuit 224 can work normally.

Figure 2:
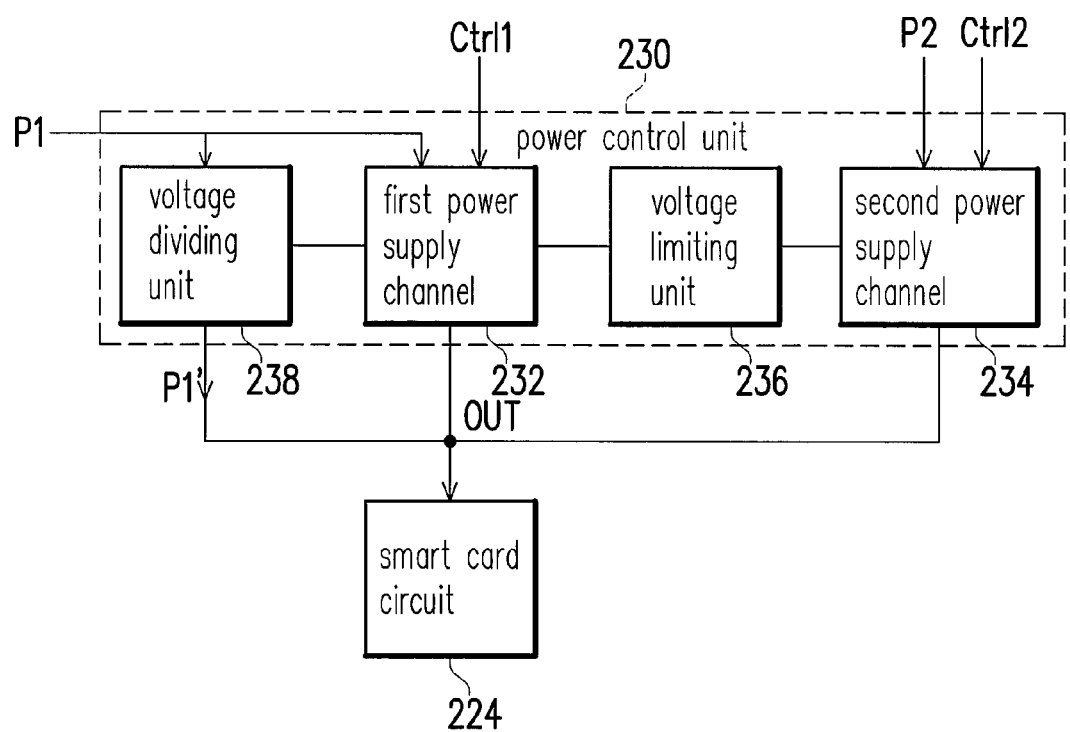
FIG. 2 is a schematic block diagram illustrating a power control unit according to an exemplary embodiment of the disclosure.

Furthermore, FIG. 2 is a schematic block diagram illustrating a power control unit according to an exemplary embodiment of the disclosure. Referring to FIG. 2, a power control unit 230 of the present exemplary embodiment includes a first power supply channel 232, a second power supply channel 234, a voltage limiting unit 236 and a voltage dividing unit 238.

The first power supply channel 232 receives a first power input P1 and determines whether to provide the first power input P1 to the smart card circuit 224 according to a first control signal Ctrl1. In the present exemplary embodiment, the first control signal Ctrl1 changes its status in response to the first power input P1 so as to control the first power supply channel 232. Herein, the first control signal Ctrl1 is, for example, obtained by inverting the first power input P1, but the disclosure is not limited thereto. In another exemplary embodiment, when the power control unit 230 determines that the first power input P1 is higher than a predetermined voltage level, the first control signal Ctrl1 which is configured to control the input of the first power input P1 to the smart card circuit 224 is provided. On the other hand, the second power supply channel 234 receives a second power input P2 and determines whether to provide the second power input P2 to the smart card circuit 224 according to a second control signal Ctrl2. In the present exemplary embodiment, the first power input P1, for example, serves as the second control signal Ctrl2 to control whether to conduct the second power supply channel 234, but the disclosure is not limited thereto. In another exemplary embodiment, when the power control unit 230 determines that the second power input P2 is higher than a predetermined voltage level, the second control signal Ctrl2 which is configured to control the input of the second power input P2 to the smart card circuit 224 and the first control signal Ctrl1 which is configured to cut off the first power supply channel 232 are provided.

The voltage limiting unit 236 is coupled between the first power supply channel 232 and the second power supply channel 234 for limiting a reverse voltage fed back to the second power supply channel 234 from the first power supply channel 232 to smaller than a specific value. In the present exemplary embodiment, the specific value is not higher than 60% of the corresponding power input or 1V. For example, when the first power supply channel 232 provides the first power input P1, the specific value is not higher than 60% of the first power input P1, i.e. 0.6 times thereof. Furthermore, when the memory card reading apparatus 110 provides the power, the first power input P1 of 3.3 voltages is output to the smart card circuit 224 from the first power supply channel 232. In the meantime, the first power supply channel 232 also provides a reverse voltage fed back to the second power supply channel 234 so as to affecting the second power input P2. Accordingly, in the present exemplary embodiment, to comply with the UICC standard, for example, as for the smart card circuit 224, the present exemplary embodiment accompanying with the voltage limiting unit 236 can limit the reverse voltage fed back from the first power supply channel 232 to about 0.3V, which is smaller than 0.5V. However, the disclosure is not limited thereto. The limitation regarding the reverse voltage fed back between power supply channels can be set according to design requirements. In the present exemplary embodiment, the first power input P1 actually provided to the smart card circuit 224 is about 3.28V. Thus, a conduction loss of the first power input P1 input to the data processing control unit 220 is smaller than 0.15V.

Otherwise, when the NFC reading apparatus 120 provides 1.8V for the second power input P2, the second power supply channel 234 also provides the reverse voltage fed back to first power supply channel 232. With the voltage limiting unit 236 in the present exemplary embodiment, the reverse voltage fed back from the second power supply channel 234 is limited to smaller than 0.5V. In other words, when any one of the power inputs does not exist, the design structure according to the present exemplary embodiment can not only achieve the selection of one power supply from two power inputs but also provide the fed back reverse voltage about 0.3V, i.e. smaller than 0.5V, which complies with the UICC standard. In the present exemplary embodiment, the second power input P2 actually provided to the smart card circuit 224 is about 1.78V. Thus, the conduction loss of the second power input P2 input to the data processing control unit 220 is also smaller than 0.15V.

The voltage dividing unit 238 divides a voltage of the first power input P1 and provides the divided voltage P1' to an output terminal OUT of the power control unit 230 via a voltage dividing node. In other words, after being divided, the divided first power input P1 is coupled to the output terminal OUT of the power control unit 230, and thus, the output voltage of the power control unit 230 is connected with the first power input P1. That is, when the first power input P1 is 3.3V, the output is 3.3V, or otherwise, the output is 1.8V. With such a connection design, the present exemplary embodiment can avoid an erroneous operation that the voltage of the first power input P1 decreases to 1.8V or 0V when the second power input P2 is switched to the first power input P1. In the present exemplary embodiment, the power control unit 230 includes the voltage dividing unit 238. In other exemplary embodiments, the voltage dividing unit 238 can be selectively disposed according to actual design requirements. That is, the power control unit can selectively include the voltage dividing unit or not.

Figure 3:
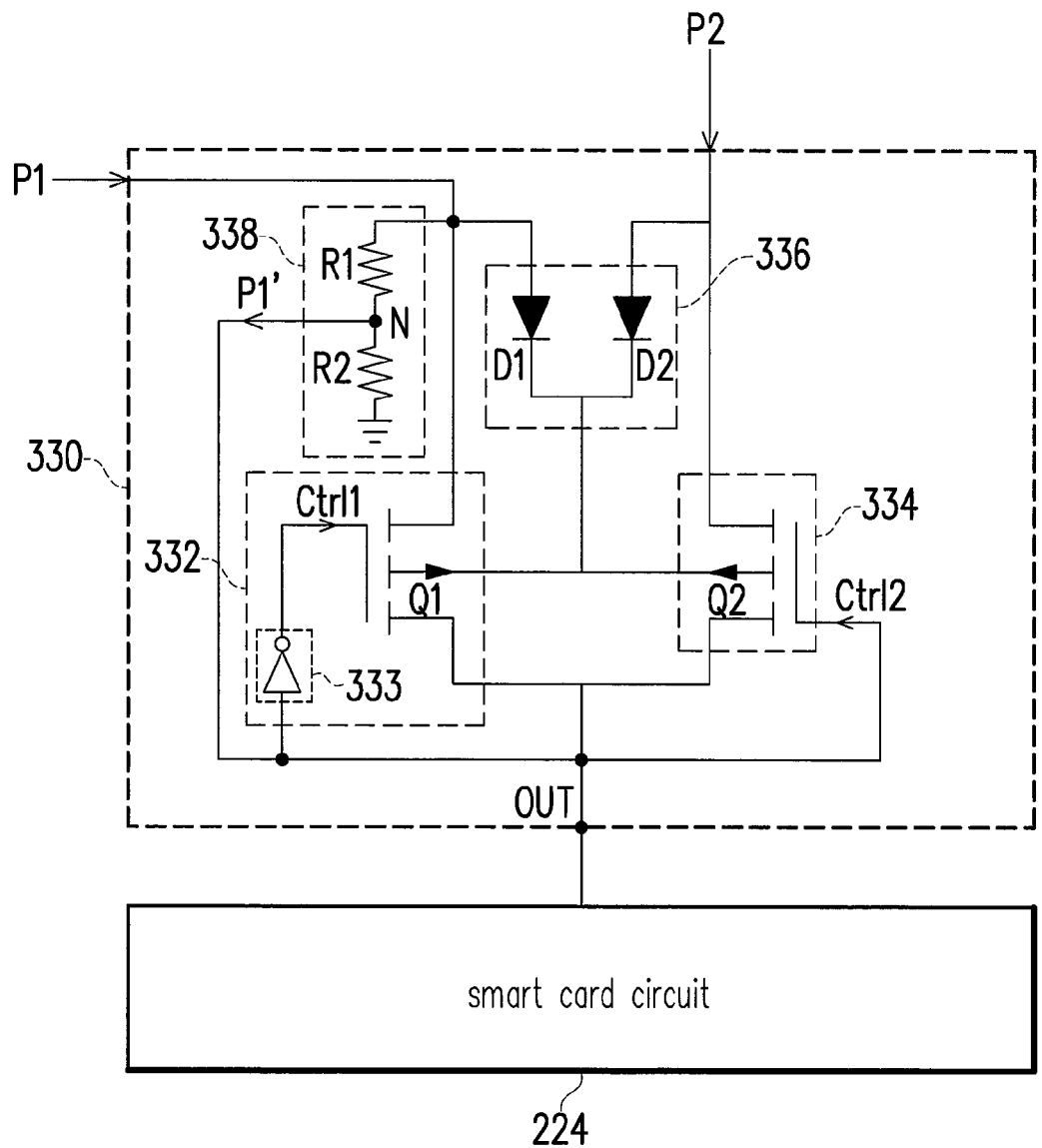
FIG. 3 is a schematic circuit diagram illustrating a power control unit according to an exemplary embodiment of the disclosure.

FIG. 3 is a schematic circuit diagram illustrating a power control unit according to an exemplary embodiment of the disclosure. Referring to FIG. 3, a first power supply channel 332 of the exemplary embodiment includes a first switch device Q1 and a signal receiving unit 333. In the present exemplary embodiment, a first switch device Q1 is implemented by, for example, a transistor device, e.g. a P-type metal oxide semiconductor field effect transistor (P-MOSFET), but the disclosure is not limited thereto. The first switch device Q1 has a first terminal, a second terminal, and a control terminal. Accordingly, the first terminal, the second terminal, and the control terminal respectively correspond to a source, a drain and a gate of the P-MOSFET. The first terminal of the first switch device Q1 receives the first power input P1. The second terminal of the first switch device Q1 is coupled to an output terminal OUT of the power control unit 330. The control terminal of the first switch device Q1 is coupled to the signal receiving unit 333 to receive the first control signal Ctrl1. The signal receiving unit 333 has an input terminal and an output terminal. The input terminal of the signal receiving unit 333 receives the first power input P1 and processes the first power input P1 as the first control signal Ctrl1. The output terminal of the signal receiving unit 333 is coupled to the control terminal of the first switch device Q1 and outputs the first control signal Ctrl1 to the first switch device Q1 to control a conduction status thereof. In the present exemplary embodiment, the signal receiving unit 333 includes an inverter so as to invert the first power input P1 as the first control signal Ctrl1.

A second power supply channel 334 includes a second switch device Q2. In the present exemplary embodiment, the second switch device Q2 is implemented by, for example, a P-MOSFET, but the disclosure is not limited thereto. The second switch device Q2 has a first terminal, a second terminal and a control terminal. Accordingly, the first terminal, the second terminal and the control terminal of the second switch device Q2 respectively correspond to a source, a drain and a gate of the P-MOSFET. The first terminal of the second switch device Q2 receives a second power input P2. The second terminal of the second switch device Q2 is coupled to the output terminal OUT of the power control unit 330. The control terminal receives the first power input P1 as the second control signal Ctrl2.

In the present exemplary embodiment, the first switch device Q1 and the second switch device Q2 are respectively implemented by the P-MOSFET. Under such a design architecture, the conduction loss thereof is about 0.02V. In one of the implementation aspects that the first power input P1 is 3.3V, and the second power input P2 is 1.8V, it is sure that the voltage of the first power input P1 output by the first power supply channel 332 is about 3.28V. In the meantime, it is also sure that the voltage of the second power input P2 output by the second power supply channel 334 is about 1.78V, which complies with the UICC standard. The foregoing voltage values, such as 0.02V, 3.3V, 3.28V, 1.8V and 1.78V, are exemplary for description, and the disclosure is not limited thereto.

A voltage limiting unit 336 includes a first diode D1 and a second diode D2. An anode of the first diode D1 is coupled to the first power input P1, and a cathode thereof is coupled to the first terminal of the first switch device Q1. The anode of the second diode D2 is coupled to the second power input P2, and the cathode thereof is coupled to the first terminal of the second switch device Q2. By this circuit structure, both the reverse voltage fed back from the first power supply channel 332 and from the second power supply channel 334 are limited to smaller than 0.5V. In the present exemplary embodiment, when either power input does not exist, the reverse voltage fed back from each power supply channel is, for example, 0.3V, which complies with the UICC standard. The foregoing voltage values, such as 0.3V and 0.5V, are exemplary for description, and the disclosure is not limited thereto.

In the present exemplary embodiment, a voltage dividing unit 338 has a first terminal, a second terminal and a voltage dividing node N. The first terminal of the voltage dividing unit 338 is coupled to the first power input P1. The second terminal of the voltage dividing unit 338 is coupled to the ground. The voltage dividing unit 338 divides the voltage of the first power input P1 and provides the divided first power input P1' to the output terminal OUT of the power control unit 330 via the voltage dividing node N. The voltage dividing unit 338 of the exemplary embodiment is implemented by a first resistor R1 serially coupled with a second resistor R2. A terminal of the first resistor R1 is used as the first terminal of the voltage dividing unit 338 and coupled to the first power input P1. The other terminal of the first resistor R1 is used as a voltage dividing node N for providing the divided first power input P1' to the output terminal OUT of the power control unit 330. A terminal of the second resistor R2 is coupled to the other terminal of the first resistor R1. The other terminal of the second resistor R2 is used as a second terminal of the voltage dividing unit 338, which is coupled to the ground. The voltage dividing unit 338 provides the divided first power input P1' to the output terminal OUT of the power control unit 330. With such a connection design, the present exemplary embodiment can avoid the erroneous operation that the voltage of the first power input P1 decreases to 1.8V or 0V when the second power input P2 is switched to the first power input P1.

Figure 4:
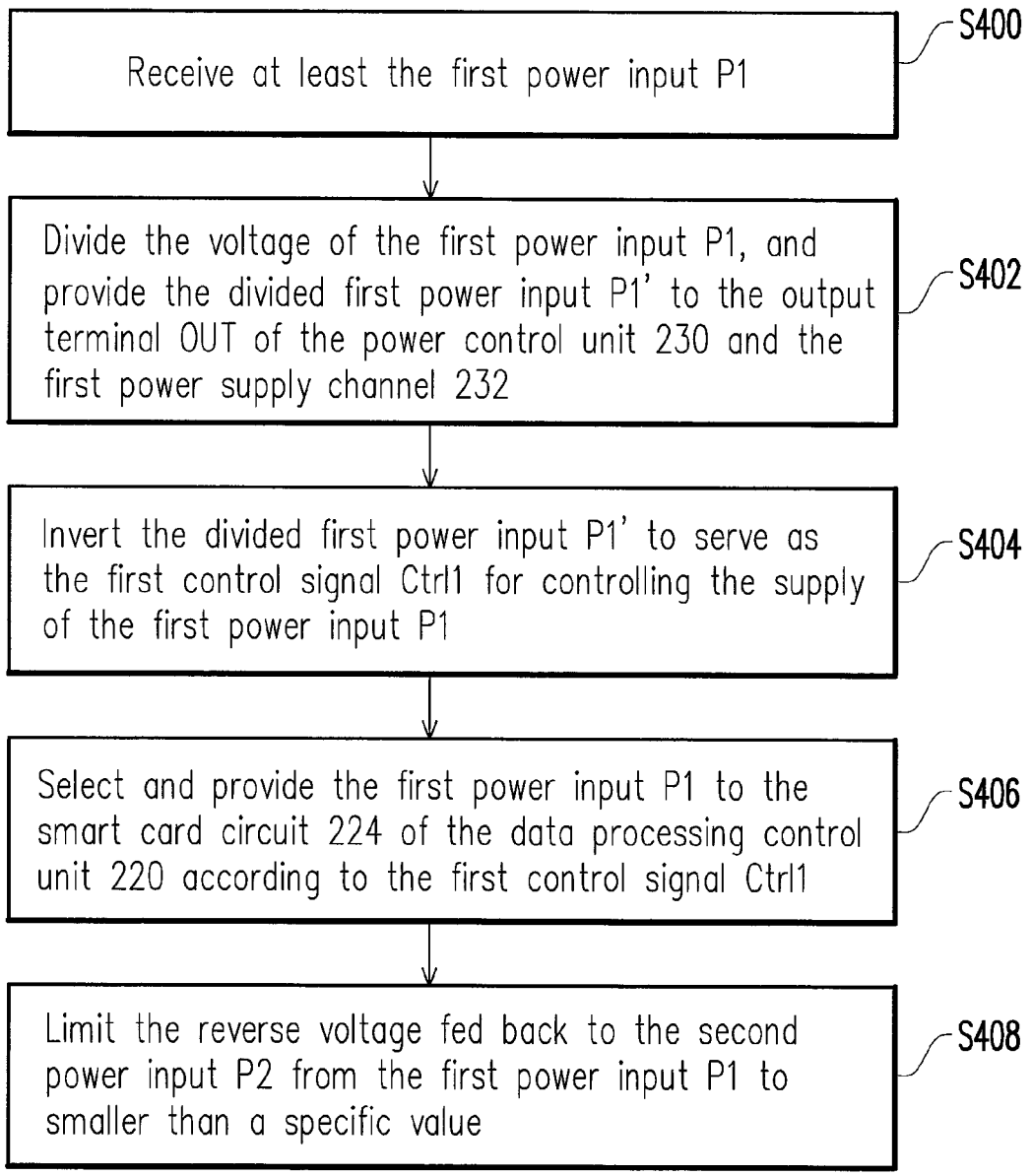
FIG. 4 is a flow chart illustrating a power control method of a memory card according to an embodiment of the disclosure.

FIG. 4 is a flow chart illustrating a power control method of an embodiment of the disclosure. Referring to FIG. 4 with FIG. 1 and FIG. 2, the power control method of the present exemplary embodiment is at least adapted to the memory card exemplarily described in FIG. 1 to FIG. 3 which includes the following steps. In step S400, at least the first power input P1 is received. In the present exemplary embodiment, the host system 100 is, for example, under a normal operation mode. The first power input P1 is provided to the power control unit 230 by the memory card reading apparatus 110. At this time, the first power input P1 is, for example, 3.3V. Otherwise, in other exemplary embodiments, the second power input P2 may be also received in step S400. Next, in step S402, the voltage of the first power input P1 is divided, and the divided first power input P1' is provided to the output terminal OUT of the power control unit 230 and the first power supply channel 232. Then, in step S404, the divided first power input P1' is inverted to serve as the first control signal Ctrl1 for controlling the supply of the first power input P1. In this step, if the voltage dividing unit 238 is selectively not disposed in the power control unit 230, then the inverted power input is the first power input P1. After that, in step S406, the first power input P1 is selected and provided to the smart card circuit 224 of the data processing control unit 220 according to the first control signal Ctrl1. Next, in step S408, the reverse voltage fed back to the second power input P2 from the first power input P1 is limited to smaller than a specific value. In step S400, if the received power input includes the second power input P2, the reverse voltage fed back to the first power input P1 from the second power input P2 is further limited to smaller than the specific value in the step S408.

Figure 5:
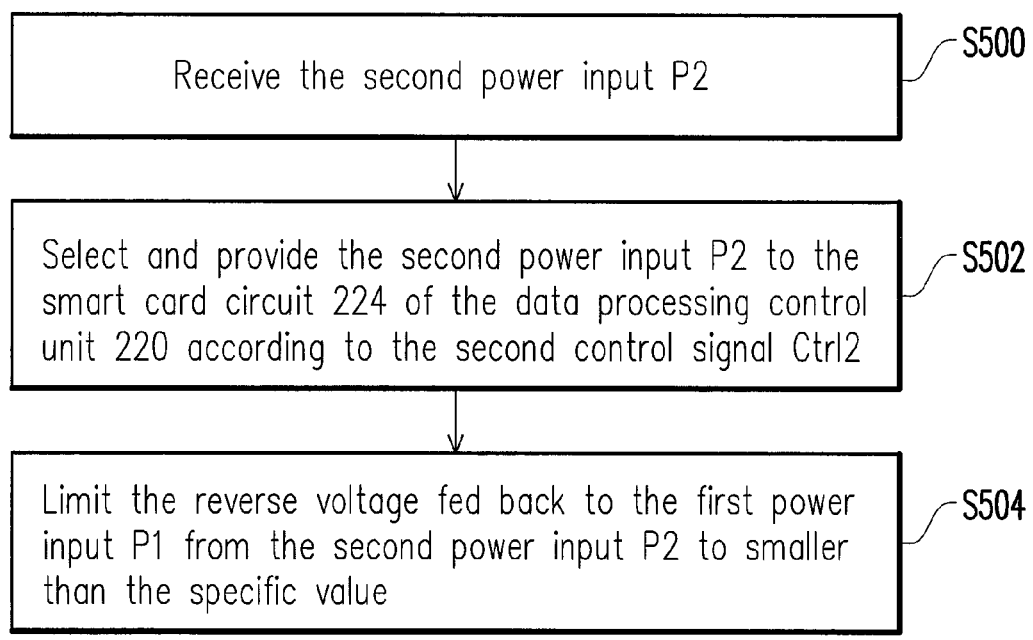
FIG. 5 is a flow chart illustrating a power control method of a memory card according to another embodiment of the disclosure.

FIG. 5 is a flow chart illustrating a power control method of a memory card according to another embodiment of the disclosure. Referring to FIG. 5 with FIG. 1 and FIG. 2, the power control method of the present exemplary embodiment is at least adapted to the memory card exemplarily described in FIG. 1 to FIG.3 which includes the following steps. In step S500, the second power input P2 is received. In the present exemplary embodiment, the second power input P2 is provided when the memory card 200 approaches to an NFC transmitting apparatus 120. The host system 100 detects a signal sent from the NFC reading apparatus 120 and decides to receive the second power input P2. At this time, the second power input P2 is provided to the power control unit 230 by the NFC reading apparatus 120, and the memory card reading apparatus 110 does not provide the power or the provided first power input P1 is in a low level status. Next, in S502, the second power input P2 is selected and provided to the smart card circuit 224 of the data processing control unit 220 according to the second control signal Ctrl2. In this step, the first power input P1 serves as the second control signal Ctrl2 to conduct the second power supply channel 234. After that, in step S504, the reverse voltage fed back to the first power input P1 from the second power input P2 is limited to smaller than the specific value.

Furthermore, the power control method according to the embodiments of the disclosure can fully acquire teachings, suggestions and implementation descriptions by reference to the embodiments as illustrated in FIG. 1 through FIG. 3, and therefore, will not be repeatedly described hereinafter.

In view of the forgoing, according to the exemplary embodiments of the disclosure, the memory card with the smart card function can conduct the near filed communication. Meanwhile, the power control method provided thereby allows the smart card therein to work normally when one of two power inputs is selected to supply the power. In addition, with the design architecture of the voltage limiting unit, when either of the power inputs does not exist, the reverse voltage fed back therefrom is limited to smaller than a specific value to comply with design specifications. Meanwhile, by connecting the power inputs with the output terminal of the power control unit, an erroneous operation due to voltage decrease when the power inputs are switched is avoided.

The previously described exemplary embodiments of the present invention have many advantages, including that the smart card circuit can work normally when one of two power inputs is selected to supply the power, wherein the advantages aforementioned not required in all versions of the invention.

It will be apparent to those skilled in the art that various modifications and variations can be made to the structure of the disclosure without departing from the scope or spirit of the invention. In view of the foregoing, it is intended that the disclosure cover modifications and variations of this invention provided they fall within the scope of the following claims and their equivalents.

What is claimed is:

1. A memory card with a smart card function, comprising:
   a flash memory unit;
   data processing control unit, coupled to the flash memory unit, configured for controlling the flash memory unit and encrypting, decrypting and storing a smart card security data; and
   a power control unit, coupled to the data processing control unit and the flash memory unit and configured for receiving at least one of a first power input and a second power input,
   wherein the power control unit is further configured to select the first power input or the second power input and provide the selected one to the data processing control unit according to at least one control signal,
   wherein the first power input is divided, and the divided first power input is coupled to an output terminal of the power control unit and directly provided to the output terminal of the power control unit,
   wherein the memory card is read by a host system, and the data processing control unit comprises a memory control circuit and a smart card circuit, and the memory control circuit identifies whether an instruction and data received via the host system is a first instruction and data to be directly transmitted to the flash memory unit, or a second instruction and the smart card security data to be processed by the smart card circuit.

2. The memory card as claimed in claim 1, wherein the power control unit comprises:
   a first power supply channel, for receiving the first power input and determining whether to provide the first power input to the data processing control unit according to a first control signal; and
   a second power supply channel, for receiving the second power input and determining whether to provide the second power input to the data processing control unit according to a second control signal,
   wherein the first control signal changes its status in response to the first power input so as to control the first power supply channel.

3. The memory card as claimed in claim 2, wherein the first power supply channel comprises:
   a first switch device, having a first terminal, a second terminal and a control terminal, wherein the first terminal of the first switch device is configured to receive the first power input, and the second terminal of the first switch device is coupled to the output terminal of the power control unit; and a signal receiving unit, having an input terminal and an output terminal, wherein the input terminal of the signal receiving unit is configured to receive the first power input and process the first power input as the first control signal, and the output terminal of the signal receiving unit is coupled to the control terminal of the first switch device and configured to output the first control signal.

4. The memory card as claimed in claim 3, wherein the signal receiving unit comprises:

an inverter, having the input terminal and the output terminal, wherein the input terminal of the inverter is configured to receive the first power input and invert the first power input as the first control signal, and the output terminal of the inverter is coupled to the control terminal of the first switch device and configured to output the first control signal.

5. The memory card as claimed in claim 2, wherein the second power supply channel comprises:

a second switch device, having a first terminal, a second terminal and a control terminal, wherein the first terminal of the second switch device is configured to receive the second power input, the second terminal of the second switch device is coupled to the output terminal of the power control unit, and the control terminal of the second switch device is configured to receive the second control signal.

6. The memory card as claimed in claim 2, wherein the power control unit further comprises:

a voltage limiting unit, coupled between the first power supply channel and the second power supply channel for limiting a reverse voltage fed back to the second power supply channel from the first power supply channel to smaller than a specific value or limiting the reverse voltage fed back to the first power supply channel from the second power supply channel to smaller than the specific value.

7. The memory card as claimed in claim 6, wherein the voltage limiting unit comprises:

a first diode, having an anode and a cathode, wherein the anode of the first diode is coupled to the first power input, and the cathode of the first diode is coupled to the first switch device; and a second diode, having an anode and a cathode, wherein the anode of the second diode is coupled to the second power input, and the cathode of the second diode is coupled to the second switch device.

8. The memory card as claimed in claim 1, wherein the first power input is provided to the output terminal of the power control unit through a voltage dividing unit having a first terminal, a second terminal and a voltage dividing node, wherein the first terminal of the voltage dividing unit is coupled to the first power input, the second terminal of the voltage dividing unit is coupled to the ground, and the voltage dividing unit configured to divide a voltage of the first power input and provide the divided first power input to the output terminal of the power control unit via the voltage dividing node.

9. The memory card as claimed in claim 8, wherein the voltage dividing unit comprises:

a first resistor, wherein one terminal of the first resistor serves as the first terminal of the voltage dividing unit, and the other terminal of the first resistor serves as the voltage dividing node and provides the divided first power input to the output terminal of the power control unit; and a second resistor, serially coupled with the first resistor, wherein one terminal of the second resistor is coupled to the other terminal of the first resistor, and the other terminal of the second resistor serves as the second terminal of the voltage dividing unit and coupled to the ground.

10. The memory card as claimed in claim 1, wherein the data processing unit comprises:

the memory control circuit, coupled to the flash memory unit and configured to control the flash memory unit; and the smart card circuit, coupled to the memory control circuit and configured to encrypt, decrypt and store the smart card security data, wherein the smart card circuit is further configured to receive the smart card security data from the host system or transmits the processed smart card security data to the host system via the memory control circuit, and the power control unit is configured to select the first power input or the second power input and provide the selected one to the smart card circuit.

11. The memory card as claimed in claim 1, wherein the flash memory unit further stores the smart card security data.

12. The memory card as claimed in claim 1, wherein the first power input is provided by a memory reading apparatus, and the second power input is provided by a near field communication (NFC) reading apparatus.

13. A power control method of a memory card read by a host system, the memory card comprising a flash memory unit, a power control unit and data processing control unit, and the data processing control unit comprising a memory control circuit and a smart card circuit, and the power control method comprising:

receiving an instruction and data received via the host system;

identifying whether the instruction and the data received via the host system is a first instruction and data to be directly transmitted to the flash memory unit, or a second instruction and a smart card security data to be processed by the smart card circuit;

receiving at least one of a first power input and a second power input from the host system;

selecting the first power input or the second power input and providing the selected one to the smart card circuit in the data processing control unit according to at least one control signal; and dividing a voltage of the first power input and directly providing the divided first power input to the output terminal of the power control unit.

14. The power control method as claimed in claim 13, wherein the step of selecting the first power input or the second power input and providing the selected one to the smart card circuit comprises:

determining whether to provide the first power input to the data processing control unit according to a first control signal, wherein the first control signal changes its status in response to the first power input so as to control a power supply of the first power input.

15. The power control method as claimed in claim 14, wherein the step of selecting the first power input or the second power input and providing the selected one to the smart card circuit further comprises:

inverting the first power input to serve as the first control signal to control the supply of the first power input.

16. The power control method as claimed in claim 14, wherein the step of selecting the first power input or the second power input and providing the selected one to the smart card circuit further comprises:
   determining whether to provide the second power input to the data processing control unit according to a second control signal, wherein the first power input serves as the second control signal.

17. The power control method as claimed in claim 13, further comprising:
   limiting a reverse voltage fed back to the second power input from the first power input to smaller than a specific value.

18. The power control method as claimed in claim 17, further comprising:
   limiting the reverse voltage fed back to the first power input from the second power input to smaller than the specific value.

19. A power control circuit, comprising:
   a first power supply channel, for receiving a first power input and determining whether to provide the first power input to data processing control unit according to a first control signal;
   a second power supply channel, for receiving a second power input and determining whether to provide the second power input to the data processing control unit according to a second control signal;
   a voltage limiting unit, coupled between the first power supply channel and the second power supply channel for limiting a reverse voltage fed back to the second power supply channel from the first power supply channel to smaller than a specific value or limiting the reverse voltage fed back to the first power supply channel from the second power supply channel to smaller than the specific value; and
   a voltage dividing unit, coupled to the first power input and configured for dividing a voltage of the first power input and directly provide to the divided first power input to the output terminal of the power control unit via a voltage dividing node.

20. The power control circuit as claimed in claim 19, wherein a conduction loss input from the first power input or the second power input to the data processing control unit is smaller than a specific value of 0.15 voltages.

21. The power control circuit as claimed in claim 19, wherein the specific value is not higher than 60% of the corresponding power input or 1 voltage.

\* \* \* \* \*